United States Patent [19]

Bossard et al.

[11] Patent Number: 4,758,777
[45] Date of Patent: Jul. 19, 1988

[54] SURFACE RESISTIVITY METER

[75] Inventors: Peter R. Bossard, Langhorne; Robert H. Dunphy, Holland, both of Pa.

[73] Assignee: Voyager Technologies, Inc., Langhorne, Pa.

[21] Appl. No.: 702,510

[22] Filed: Feb. 19, 1985

[51] Int. Cl.⁴ .......................................... G01R 27/14
[52] U.S. Cl. .................................... 324/64; 324/65 P
[58] Field of Search .............. 324/64, 62, 65 R, 65 P, 324/158 F, 158 P, 72.5; 340/815.01, 815.03

[56] References Cited

U.S. PATENT DOCUMENTS

| | | | |
|---|---|---|---|
| 2,502,059 | 3/1950 | Muzzey | 324/64 |
| 3,611,125 | 10/1971 | Sharon et al. | 324/64 |
| 3,757,218 | 9/1973 | Oliverio et al. | 324/156 |
| 4,341,992 | 7/1987 | Goldstein | 324/65 R |
| 4,408,128 | 10/1983 | Fujita | 324/65 R |

FOREIGN PATENT DOCUMENTS 1084495 6/1960 Fed. Rep. of Germany ........ 324/65

Primary Examiner—Reinhard J. Eisenzopf
Assistant Examiner—Jack B. Harvey
Attorney, Agent, or Firm—Marmorek, Guttman & Rubenstein

[57] ABSTRACT

A hand-held, low cost, low voltage surface resistivity meter is provided by a contact surface which is essentially independent of the geometry of the surface to be measured. The use of special materials for the contact surface permits increased accuracy to be achieved at low voltages. Recognition that readings shown simply to the power of 10 are fully useful in characterizing a measured material permits a low cost, low voltage arrangement for the meter.

14 Claims, 1 Drawing Sheet

SURFACE RESISTIVITY METER

FIELD OF THE INVENTION

This invention relates to surface resistivity meters.

BACKGROUND OF THE INVENTION

Surface resistivity meters are well known, commercially available instruments. Such a meter is equipped with a contact surface which has a geometry adapted for the surface which it is to measure. In one available unit, for example, the instrument includes a contact surface comprising a central disk-shaped electrode and an annular electrode positioned around the disk and spaced apart from it. A voltage is impressed between the two electrodes. Electric field lines originate at the annulus and terminate at the disk producing currents which are indicative of the surface resistivity of the material with which the instrument is in contact.

One problem with an arrangement of this type is that frequently the disk and annulus do not make proper contact with the surface to be measured. The surface, for example, may not be planar. Consequently, complete contact is impossible and incorrect resistivity readings are obtained. Problems of this kind are overcome to some extent by providing a flexible surface material on the disk and annulus so that they can conform to the surface to be measured. Such materials are ionic conductors which make the instrument relatively insensitive. Consequently, such instruments require relatively high voltages, about 1000 volts, for operation because they need to have relatively high currents to measure.

Moreover, available resistivity meters provide readings to several digits times 10 to a power. Circuitry to provide such a reading is expensive and the reading is misleading because it offers a degree of confidence which is not supported by the accuracy of the measurement.

Surface resistivity meters typically comprise an enclosure and the contact surface is connected to a cable. The enclosure is of considerable size and the cable is often inconvenient.

BRIEF DESCRIPTION OF THE INVENTION

A simple, hand-held, resistivity meter is provided with a built-in contact surface which is independent of the surface to be measured and operative at low voltages. The meter sits on three short legs with tips made of intrinsically conductive materials rather than ionic materials. A typical intrinsically conductive material is carbon loaded rubber.

The legs are spaced apart, typically on the circumference of a three-inch diameter circle. Three legs define a contact surface and "conform" to variations in geometry of the surface to be measured. The use of intrinsically conductive material for the legs is preferred because the materials measured do not follow ohms law and ionic materials for the contact surface would not provide accurate readings at low voltages.

The instrument includes a spring loaded, probe-like electrode positioned at the center of the circle defined by the legs. A voltage of 30 volts is impressed between the spring loaded electrode and the legs. Measurements are obtained merely by pressing the instrument against the surface to be measured.

Readings are provided only in powers of 10. Additional digits representing the prior art resistivity readings supposedly more accurately are, in fact, inaccurate. Fortunately, such detailed representation is unnecessary because a representation to a power of 10 is quite acceptable for specifying the surface measured.

The meter is hand held, easy to use, accurate, low voltage and inexpensive.

DETAILED DESCRIPTION

Figure 1:
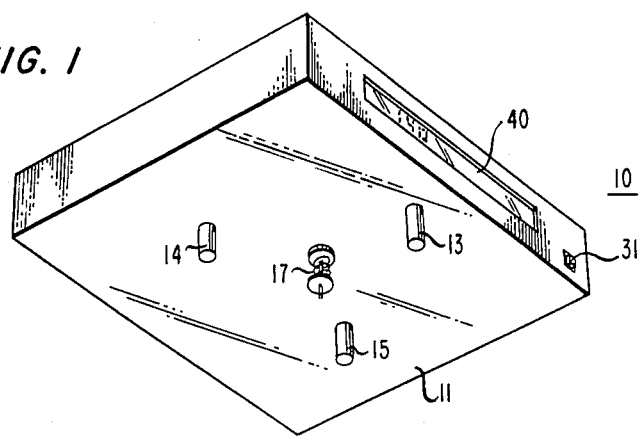
FIG. 1 is a plan view of a surface resistivity meter in accordance with this invention.

FIG. 1 shows a projection view of a surface resistivity meter 10 in accordance with this invention. The meter is small enough to be hand-held measuring only four inches by six inches by four inches high. The meter is adapted to be pressed against a surface to be measured.

The underside of the meter, as viewed, is adapted as the contact surface to be pressed against a surface to be measured. The underside surface of the meter is designated 11 and can be seen to include a plurality of legs, illustratively three, protruding from it. The legs are designated 13, 14, and 15 in the FIGURE.

The legs constitute an important aspect of this invention because they define a contact surface independent of the geometry of the surface to be measured. Three legs (ends) define a plane as is well known. The legs are spaced apart on the circumference of a circle which, conveniently, has a three-inch diameter. The legs are three-eighths of an inch long, conveniently, and are adapted to contact the surface to be measured regardless of geometric variations in that surface.

The legs are adapted to make electrical contact to the surface to be measured. It is recognized that such surfaces are not ohmic in nature requiring currents in excess of a characteristic threshold to be present before a resistivity measurement is possible. Consequently, intrinsically conducting materials, such as carbon loaded rubber, are employed for the bottoms of the legs, as viewed in FIG. 1, where the legs come in contact with the surface to be measured. Materials which are ionic conductors are avoided because resistivity measurements will measure those materials rather than the intended surface thus providing inaccurate measurements in many instances.

Figure 2:
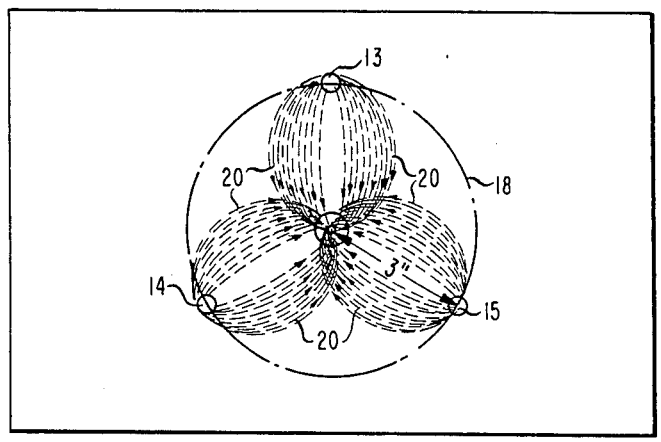
FIG. 2 is an enlarged view of the contact surface of the meter of FIG. 1.

A spring-loaded electrode 17 is located centrally with respect to legs 13, 14, and 15. Electrode 17 is longer than the legs and is adapted to be depressed when pressed into contact with a surface to be measured. Electrode 17, conveniently, is located at the center of the circle defined by the three legs as shown in FIG. 2. The circle is represented by imaginary broken line 18, which, in the preferred embodiment, represents a three-inch circle.

A power supply is connected to the legs in a manner to generate electric field lines which terminate at electrode 17. The electric field lines are represented in FIG. 2 by broken curved arrows 20. It has been found that virtually no electric field lines are present outside of the circumference of the circle defined by legs 13, 14, and 15.

Figure 3:
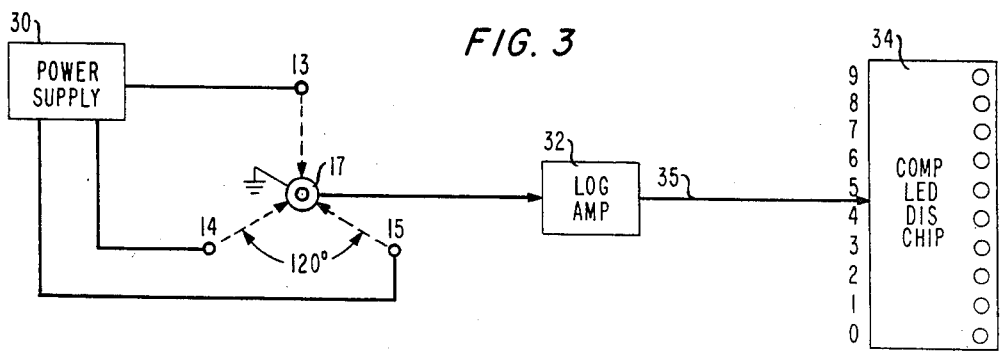
FIG. 3 is a circuit diagram of the meter of FIG. 1.

FIG. 3 shows a circuit schematic for the resistivity meter. Legs 13, 14, and 15 are shown again 120 degrees apart with electrode 17 at the center. Power supply 30 is shown in FIG. 3 as connected to each of the legs. The power supply is adapted to impress 30 volts between the legs and electrode 17 thus giving rise to electric field lines 20. The power supply is turned on in response to the depression of key 31 shown in FIG. 1. Electrode 17 is connected to a logarithmic amplifier (log amp) 32 which is available commercially from, for example, Intersil Corporation, their log amp 8048 chip.

The current flow between the legs and the electrode is averaged because of the geometric arrangement of the contact surface. The average current is applied to the log amp. Log amp 32, in turn, applies one of ten voltage values, 0-9, to the inputs to a comparator, light-emitting diode (LED) display chip 34. The single wire connecting the log amp 32 to chip 34 is represented by line 35.

The inputs to chip 34 are designated 1-9 and the corresponding LED output display is represented by a circle, to the right as viewed in FIG. 3. Depending on which input to 34 is activated, a corresponding LED display is illuminated. The display appears at 40 in FIG. 1. A test of a surface is initiated merely by pressing the meter's contact surface (legs) against the test surface. The test terminates merely by lifting the meter off the surface.

The display chip is available commercially from a number of sources. One source is National Semiconductor Inc. number NSM-3914.

The display, as has been stated hereinbefore, appears in terms of powers of ten only. The reason for this is that it was recognized that additional digits representing the resistivity, supposedly more precisely, never stabilized. That is to say, those digits were constantly changing during a reading. Consequently, the digits were unreliable and fortunately not even necessary. Material resistivities are classified in powers of ten as a matter of accepted industry standards.

Chip 34 is adapted to illuminate a particular LED (from 0-9) according to the following table:

| LED Activated | Resistivity in Ohm/Square |
| --- | --- |
| 0 | $<10^4$ |
| 1 | $>10^4$ and $<10^{5.5}$ |
| 2 | $>10^{5.5} = 3.16 \times 10^5$ and $<10^{6.5}$ |
| 3 | $>10^{6.5} = 3.16 \times 10^6$ and $<10^{7.5}$ |
| 4 | $>10^{7.5} = 3.16 \times 10^7$ and $<10^{8.5}$ |
| 5 | $>10^{8.5} = 3.16 \times 10^8$ and $<10^{9.5}$ |
| 6 | $>10^{9.5} = 3.16 \times 10^9$ and $<10^{10.5}$ |
| 7 | $>10^{10.5} = 3.16 \times 10^{10}$ and $<10^{11.5}$ |
| 8 | $>10^{11.5} = 3.16 \times 10^{11}$ and $<10^{12.5}$ |
| 9 | $>10^{12.5} = 3.16 \times 10^{12}$ |

Display 40 of FIG. 1 includes the symbols for each power of 10. The circuit of FIG. 3 is operative to activate the display for illuminating the proper symbol.

The recognition that extra digits in the read out of prior art resistivity meters were unstable and really unnecessary has led to the realization that low cost existing integrated circuit chips and LED chip arrangements could be used to implement a relatively inexpensive surface resistivity meter. The recognition that a meter contact surface having a geometry independent of the test surface geometry along with the recognition that in order to determine, in general, if a material will discharge to a low voltage (typically 30 Volts) the surface resistivity has to be measured using a low voltage technique.

The independent contact surface geometry, the materials used, and the resulting low voltage arrangement are considered significant departures from prior art and thinking on resistivity meters and has led to a hand-held meter at only a fraction of the cost (one-third) that of prior art meters.

What is claimed is:

1. A surface resistivity meter for measuring surface resistivity including a contact surface comprising a plurality of legs spaced apart in a manner to define a plane for standing said resistivity meter on a surface to be tested, a spring loaded electrode positioned centrally with respect to said legs, means for impressing a voltage between said electrode and said legs and means for providing a reading of current flowing between said electrode and said legs, said current being indicative of the surface resistivity of the test surface.

2. A meter in accordance with claim 1 wherein said legs include surfaces of intrinsically conductive material.

3. A meter in accordance with claim 2 wherein said legs include surfaces of carbon loaded rubber.

4. A meter in accordance with claim 1 wherein said means for impressing a voltage is adapted to impress a voltage of much less than 1000V.

5. A meter in accordance with claim 4 wherein said means for impressing a voltage is adapted to impress on the order of 30 volts.

6. A meter in accordance with claim 2 wherein said means for impressing a voltage is adapted to impress on the order of 30 volts.

7. A meter in accordance with claim 3 wherein said means for impressing a voltage is adapted to impress about 30 volts.

8. A meter in accordance with claim 1 wherein said plurality of legs comprises three legs.

9. A meter in accordance with claim 1 including a logarithmic amplifier, said electrode being connected to said logarithmic amplifier and being adapted to apply thereto the average current flowing between said legs and said electrode.

10. A meter in accordance with claim 9 also including a comparator, said comparator being connected to said logarithmic amplifier, said logarithmic amplifier being adapted to apply to said comparator one of ten voltage values representative of said average current, said comparator being responsive to said voltage values for activating a corresponding display value.

11. A meter in accordance with claim 10 wherein said comparator is a semiconductor LED chip.

12. A surface resistivity meter for measuring surface resistivity, said surface resistivity meter comprising:
  first electrode means including a plurality of fixed legs extending from said meter for contacting a test surface so that the surface resistivity of said surface may be measured by standing said meter on said surface,
  second electrode means adapted to contact said surface,
  means for impressing a voltage on said surface to cause current to flow between said first and second electrode means indicative of the surface resistivity to be measured, and means for displaying the measured surface resistivity.

13. A surface resistivity meter for measuring the surface resistivity of a material comprising at least three spaced apart fixed legs positioned to define a plane, said legs extending from said meter for standing said surface resistivity meter on a surface of the material whose surface resistivity is to be measured, and a movable electrode able to adjust to the surface being measured, means for impressing a voltage between said movable electrode and said fixed legs, and means for providing a reading of the surface resistivity.

14. The meter of claim 13 wherein said legs comprise a soft conductive material.

* * * * *